United States Patent
Chen et al.

(10) Patent No.: US 11,842,009 B2
(45) Date of Patent: Dec. 12, 2023

(54) TOUCHSCREEN WITH COORDINATE VALUES INDICATIVE OF A TENTH OF A PIXEL

(71) Applicants: STMicroelectronics (BEIJING) R&D Co., LTD, Beijing (CN); STMicroelectronics (Shenzhen) R&D Co., Ltd., Shenzhen (CN)

(72) Inventors: Bowei Chen, Shenzhen (CN); Yue Ding, Beijing (CN); Guodong Sun, Beijing (CN)

(73) Assignees: STMICROELECTRONICS (BEIJING) R&D CO., LTD, Beijing (CN); STMicroelectronics (Shenzhen) R&D Co., Ltd., Shenzhen (CN)

( * ) Notice: Subject to any disclaimer, the term of this patent is extended or adjusted under 35 U.S.C. 154(b) by 0 days.

(21) Appl. No.: 17/677,119

(22) Filed: Feb. 22, 2022

(65) Prior Publication Data
US 2023/0266845 A1     Aug. 24, 2023

(51) Int. Cl.
| | |
|---|---|
| G06F 3/041 | (2006.01) |
| G06F 3/044 | (2006.01) |
| H03M 1/20 | (2006.01) |
| H04L 65/00 | (2022.01) |
| H04N 21/462 | (2011.01) |

(52) U.S. Cl.
CPC .......... *G06F 3/0418* (2013.01); *G06F 3/0412* (2013.01); *G06F 3/0446* (2019.05); *G06F 3/0447* (2019.05); *H03M 1/20* (2013.01); *H04L 65/00* (2013.01); *H04N 21/4621* (2013.01)

(58) Field of Classification Search
CPC .... G06F 3/0418; G06F 3/0446; G06F 3/0447; G06F 3/0412
See application file for complete search history.

(56) References Cited

U.S. PATENT DOCUMENTS

| | | | | |
|---|---|---|---|---|
| 4,507,523 | A  * | 3/1985 | Gohara | G06F 3/046 178/19.03 |
| 2003/0095129 | A1* | 5/2003 | Wakasugi | G06K 15/02 345/581 |
| 2012/0249454 | A1* | 10/2012 | Teraguchi | H10K 59/40 345/173 |

(Continued)

OTHER PUBLICATIONS

Atmel, "maXTouch 1386-channel Touchscreen Controller," mXT1386E Revision 2.9, Sep. 1, 2012, 94 pages.

(Continued)

*Primary Examiner* — Liliana Cerullo
(74) *Attorney, Agent, or Firm* — Slater Matsil, LLP

(57) ABSTRACT

A method for operating an electronic device includes detecting, by a touchscreen controller, a touch point on a touchscreen; determining, by the touchscreen controller, coordinates of the touch point; scaling, by the touchscreen controller, up the coordinates of the touch point to obtain scaled up coordinates by overwriting a reserved portion of a touch event protocol with additional information corresponding to the coordinates of the touch point; reporting, by the touchscreen controller, the scaled up coordinates of the touch point to an application processor; and determining, by the application processor, the coordinates of the touch point with an increased resolution by converting the scaled up coordinates into a floating point value.

20 Claims, 6 Drawing Sheets

402

| Byte | Bit 7 | Bit 6 | Bit 5 | Bit 4 | Bit 3 | Bit 2 | Bit 1 | Bit 0 |
|---|---|---|---|---|---|---|---|---|
| Byte 0 | Event ID | | | | Touch ID | | | |
| Byte 1 | Resolution Flag | | | | Touch Type | | | |
| Byte 2 | Coordinate X[7:0] | | | | | | | |
| Byte 3 | Coordinate Y[3:0] | | | | Coordinate X[11:8] | | | |
| Byte 4 | Coordinate Y[11:4] | | | | | | | |
| Byte 5 | Reserved1 [0:7] | | | | | | | |

404

| Byte | Bit 7 | Bit 6 | Bit 5 | Bit 4 | Bit 3 | Bit 2 | Bit 1 | Bit 0 |
|---|---|---|---|---|---|---|---|---|
| Byte 0 | Event ID | | | | Touch ID | | | |
| Byte 1 | Resolution Flag | | | | Touch Type | | | |
| Byte 2 | Coordinate X[7:0] | | | | | | | |
| Byte 3 | Coordinate X[15:8] | | | | | | | |
| Byte 4 | Coordinate Y[7:0] | | | | | | | |
| Byte 5 | Coordinate Y[15:8] | | | | | | | |

(56) References Cited

U.S. PATENT DOCUMENTS

| | | | |
|---|---|---|---|
| 2013/0003624 A1* | 1/2013 | Huang | H04L 65/65 370/310 |
| 2013/0127756 A1 | 5/2013 | Wang et al. | |
| 2014/0316729 A1 | 10/2014 | Kremin et al. | |
| 2015/0222730 A1* | 8/2015 | Gower | H04L 67/01 709/203 |
| 2018/0314388 A1 | 11/2018 | Kuo et al. | |
| 2018/0338065 A1 | 11/2018 | Zyskind et al. | |

OTHER PUBLICATIONS

Microchip, "maXTouch 1664-node Touchscreen Controller," mXT1664T3 2.0, Microchip Technology Inc, Jan. 1, 2019, 98 pages.

* cited by examiner

402

| Byte | Bit 7 | Bit 6 | Bit 5 | Bit 4 | Bit 3 | Bit 2 | Bit 1 | Bit 0 |
|---|---|---|---|---|---|---|---|---|
| Byte 0 | Event ID | | | | | | Touch ID | |
| Byte 1 | Resolution Flag | | | | | | Touch Type | |
| Byte 2 | Coordinate X[7:0] | | | | | | | |
| Byte 3 | Coordinate Y[3:0] | | | | Coordinate X[11:8] | | | |
| Byte 4 | Coordinate Y[11:4] | | | | | | | |
| Byte 5 | Reserved1 [0:7] | | | | | | | |

404

| Byte | Bit 7 | Bit 6 | Bit 5 | Bit 4 | Bit 3 | Bit 2 | Bit 1 | Bit 0 |
|---|---|---|---|---|---|---|---|---|
| Byte 0 | Event ID | | | | | | Touch ID | |
| Byte 1 | Resolution Flag | | | | | | Touch Type | |
| Byte 2 | Coordinate X[7:0] | | | | | | | |
| Byte 3 | Coordinate X[15:8] | | | | | | | |
| Byte 4 | Coordinate Y[7:0] | | | | | | | |
| Byte 5 | Coordinate Y[15:8] | | | | | | | |

| Byte | Bit 7 | Bit 6 | Bit 5 | Bit 4 | Bit 3 | Bit 2 | Bit 1 | Bit 0 |
|---|---|---|---|---|---|---|---|---|
| Byte 0 | | | Event ID | | | Reserved0[2:3] | | Resolution Flag |
| Byte 1 | | | Touch ID | | | | Touch Type | |
| Byte 2 | | | | | Coordinate X[7:0] | | | |
| Byte 3 | | | Coordinate Y[3:0] | | | | Coordinate X[11:8] | |
| Byte 4 | | | | | Coordinate Y[11:4] | | | |
| Byte 5 | | | | | Reserved1[0:7] | | | |
| Byte 6 | | | | | Reserved2[0:7] | | | |
| Byte 7 | Reserved3[6:7] | | | | | Evtleft | | |

408

| Byte | Bit 7 | Bit 6 | Bit 5 | Bit 4 | Bit 3 | Bit 2 | Bit 1 | Bit 0 |
|---|---|---|---|---|---|---|---|---|
| Byte 0 | | | Event ID | | | Reserved0[2:3] | | Resolution Flag |
| Byte 1 | | | Touch ID | | | | Touch Type | |
| Byte 2 | | | | | Coordinate X[7:0] | | | |
| Byte 3 | | | | | Coordinate X[15:8] | | | |
| Byte 4 | | | | | Coordinate Y[7:0] | | | |
| Byte 5 | | | | | Coordinate Y[15:8] | | | |
| Byte 6 | | | | | Reserved2[0:7] | | | |
| Byte 7 | Reserved3[6:7] | | | | | Evtleft | | |

Fig. 4B

TOUCHSCREEN WITH COORDINATE VALUES INDICATIVE OF A TENTH OF A PIXEL

TECHNICAL FIELD

The present invention relates generally to a system and method for operating an electronic device including a touchscreen.

BACKGROUND

Electronic devices that are designed for user interaction have historically utilized external input devices such as keyboards, key pads, and/or mice to capture user input. In recent years, there has been a push from the more traditional methods, as consumers prefer the convenience of portable devices that can support a more flexible lifestyle. To this end, there has been a rise in smaller, portable, hand-held electronic devices, such as mobile phones, tablets, gaming systems, etc. This has given rise to the popularity of touchscreens and touch panel displays as systems for capturing user input. Not only do they provide the functionality of the traditional electronic devices, but touchscreens provide additional features. For example, given the appropriate software, users are able to utilize touchscreens for sketching, drawing, and various hand-writing applications.

Electronic devices such as mobile phones, tablets, and gaming systems include a touchscreen for displaying image information. Conventional touchscreens, known as capacitive touchscreens, comprise a plurality of pixels (e.g. touch sensors) formed at the intersections of sense lines and drive lines that span across the entirety of the touchscreen. When a capacitive object such as a user's finger or a passive stylus, an active stylus pen, or the like are sensed by the touchscreen, the touchscreen may sense a change in capacitance that may be used to determine the coordinates of the touch point.

However, in conventional electronic devices, the resolution of touch coordinates are limited to whole pixel values. The coordinates of a touch point correspond to intersections between a drive line and a sense line. In other words, the resolution of the touch coordinates are limited to the resolution of the touchscreen.

SUMMARY

In an embodiment, a method for operating an electronic device includes: detecting, by a touchscreen controller, a touch point on a touchscreen; determining, by the touchscreen controller, coordinates of the touch point; scaling, by the touchscreen controller, up the coordinates of the touch point to obtain scaled up coordinates by overwriting a reserved portion of a touch event protocol with additional information corresponding to the coordinates of the touch point; reporting, by the touchscreen controller, the scaled up coordinates of the touch point to an application processor; and determining, by the application processor, the coordinates of the touch point with an increased resolution by converting the scaled up coordinates into a floating point value.

In an embodiment, a method for operating an electronic device includes: determining, by a touchscreen controller, a base resolution of a touchscreen; determining, by the touchscreen controller, coordinates of a touch point on the touchscreen, the coordinates of the touch point having the same resolution as the base resolution of the touchscreen; determining, by the touchscreen controller, whether coordinates of the touch point with a resolution greater than the base resolution of the touchscreen are requested by an application processor; and in response to determining, by the touchscreen controller, that coordinates of the touch point with a resolution greater than the base resolution of the touchscreen are requested, determining scaled up coordinates of the touch point from the coordinates of the touch point, and generating a first touch event data payload including the scaled up coordinates, and reporting, by the touchscreen controller, the first touch event data payload; and determining from the first touch event data payload, by the application processor, coordinates of the touch point with a resolution greater than the base resolution of the touchscreen.

In an embodiment, a device includes: a touchscreen controller; and a memory for storing a program to be executed in the controller, the program including instructions when executed cause the controller to: detect a touch point on a touchscreen; determine coordinates of the touch point; scale up the coordinates of the touch point to obtain scaled up coordinates by overwriting a reserved portion of a touch event protocol with additional information corresponding to the coordinates of the touch point; report the scaled up coordinates of the touch point to an application processor; and determine coordinates of a touch point with an increased resolution by converting the scaled up coordinates into floating point values.

BRIEF DESCRIPTION OF THE DRAWINGS

For a more complete understanding of the present invention, and the advantages thereof, reference is now made to the following descriptions taken in conjunction with the accompanying drawings, in which:

FIGS. 1A-1C illustrate an electronic device having a touchscreen that is configured to determine touch coordinates with a resolution greater than the resolution of the touchscreen in accordance with an embodiment of the present application, wherein FIG. 1A illustrates a component schematic of the electronic device, FIG. 1B illustrates a schematic cross-sectional view of the touchscreen, and FIG. 1C illustrates a schematic circuit of a touch sensitive layer of the electronic device;

FIGS. 4A-4B illustrate schematic views of touch event protocols used to report touch coordinates with the same resolution of the touchscreen and a touch event protocol used to report touch coordinates with a resolution greater than the resolution of the touchscreen according to an embodiment of the present application, where FIG. 4A illustrates a 40-bit touch event protocols, and FIG. 4B illustrates 64-bit touch event protocols.

DETAILED DESCRIPTION OF ILLUSTRATIVE EMBODIMENTS

While touchscreens have led to great advances in the evolution of portable electronic devices, due to their delicate nature there are still limitations that exist. Namely, coordinates determined for a touch point are limited to the resolution of the touchscreen. Touch coordinates determined from conventional capacitive touchscreens, are limited to whole pixel units. In other words, coordinates of a touch point may correspond to a single pixel of a plurality of pixels (e.g. touch sensors) formed by the intersections of sense lines and drive lines that span across the entirety of the touchscreen. Touch coordinates may be limited to intersections of drive lines and sense lines. In other words, touch coordinates cannot correspond to locations between intersections of drive lines and sense lines and are in whole pixel units.

Embodiments of the current application relate to an electronic device that can determine coordinates of a touch point with an increased resolution. Various embodiments of the present application relate to an electronic device that can determine coordinates of a touch point with a resolution greater than the resolution of the touchscreen.

Figure 1A:
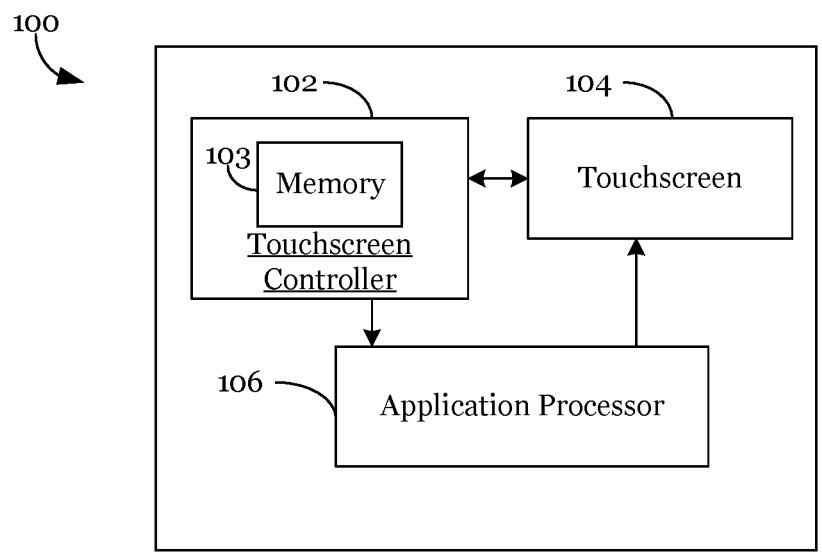
Figure 1B:
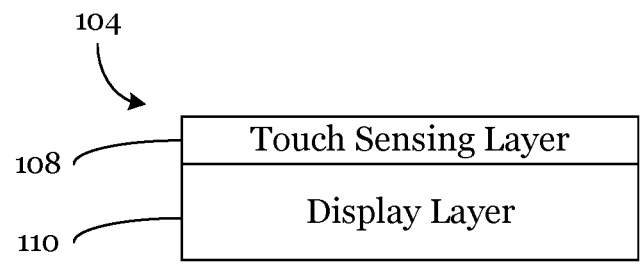
Figure 1C:
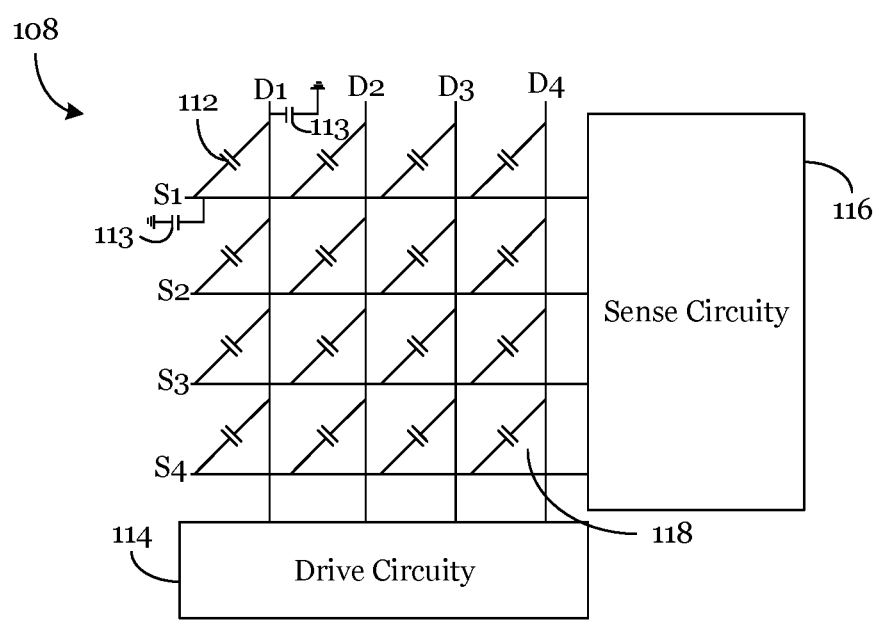

FIGS. 1A-1C illustrate an electronic device having a touchscreen that is configured to determine touch coordinates with a resolution greater than the resolution of the touchscreen accordance with an embodiment of the present application, wherein FIG. 1A illustrates a component schematic of the electronic device, FIG. 1B illustrates a schematic cross-sectional view of the touchscreen, and FIG. 1C illustrates a schematic circuit of a touch sensitive layer of the electronic device.

Referring to FIG. 1A, an electronic device 100 may include a touchscreen controller 102, a touchscreen 104, and an application processor 106. The electronic device 100 may be a smart phone, a GPS device, a tablet computer, a mobile media player, a laptop, a gaming system, a personal computer, or any other electronic device that may utilize a touchscreen 104.

The touchscreen 104 may be an organic light emitting diode (OLED) display, an LED display, or any other type of display. The touchscreen 104 may include a plurality of pixels in a display layer configured to display an image. The plurality of pixels included in the display layer may span rows and columns of the entirety of the display layer. The touchscreen 104 may also include a touch sensing layer configured to detect touches made on the touchscreen 104. The touch sensing layer may comprise drive lines and sense lines that extend across the rows and columns across the entirety of the touchscreen 104. The intersection of each of the drive lines and sense lines may form pixels (e.g. touch sensors) across the rows and columns of the entirety of the touch sensing layer. In various embodiments, the pixels of the touch sensing layer and the display layer are aligned with one another.

The touchscreen controller 102 may perform various methods with respect to the touchscreen 104. In various embodiments, the touchscreen controller 102 may be a processor that analyzes information and carries out a series of executable scripts, e.g., stored a memory 103. In one or more embodiments, the processor may comprise an application-specific integrated circuit (ASIC) device, a central processing unit (CPU), or any other processing unit known in the art. In various embodiments, the touchscreen controller 102 may comprise a number of separate computing units such as cores integrated within one processor, or distinct separate processing chips.

In various embodiments, the memory 103 may be programmed for short term and/or long term memory storage. The memory 103 may be configured to store data generated by the touchscreen controller 102 may comprise various programs to be executed in the touchscreen controller 102.

The memory 103 may include both volatile and non-volatile memories. The memory is designed to retain information generated by the touchscreen controller 102 so it can be recalled at a later time.

In various embodiments, the application processor 106, may also be known as a system on a chip or a host, and may comprise a processor, interface, circuitry, and/or the like configured to direct the flow of input and output data to the touchscreen 104 and the associated touchscreen controller 102. A memory may be integrated onto the application processor 106. The memory may be programmed for short term and/or long term memory storage. The memory may comprise various programs to be executed in the application processor 106. The memory may include both volatile and non-volatile memories.

The touchscreen 104 is designed to register user input via touches made to its surface. The electronic device 100 may also be configured to detect input from the touchscreen 104 that may also come from input given from a stylus (active or passive) device. In various embodiments, the touchscreen 104 may include sensors such as gyroscopes or accelerometers. One or more of these sensors may be integrated together.

FIG. 1B illustrates a schematic of the touchscreen 104. In various embodiments, the touchscreen 104 may include a touch sensing layer 108 and a display layer 110. The touch sensing layer 108 and the display layer 110 may be situated on the front facing side of the electronic device 100. The display layer 110 may comprise a light emitting diode (LED) display, organic LED display, LCD, AMOLED, or any other type of display.

FIG. 1C illustrates a schematic of the touch sensing layer 108. In various embodiments, the touch sensing layer 108 may comprise drive lines D1-D4 and sense lines S1-S4 that span the entirety of the touchscreen 104 in a grid-like fashion that are operable by the touchscreen controller 102. In various embodiments, the drive lines D1-D4 may be formed in columns across the touchscreen 104 and the sense lines S1-S4 may be formed in rows across the touchscreen 104. In other embodiments, the drive lines D1-D4 may be formed in rows across the touchscreen 104 and sense lines S1-S4 may be formed in columns across the touchscreen 104. In various embodiments, the number of drive lines may not be equal to the number of sense lines. Although four drive lines and four sense lines are illustrated in FIG. 1C, this is not indicative of the number of drive and sense lines that may be present on the touch sensing layer. The number of drive and sense lines used are not limited by this application.

The drive lines D1-D4 and the sense lines S1-S4 may overlap in certain embodiments. While FIG. 1C depicts the drive lines D1-D4 and the sense lines S1-S4 overlapping in an orthogonal manner, they may overlap other than orthogonally such as being interleaved or at various angles.

The drive lines D1-D4 and the sense lines S1-S4 may have a measurable mutual capacitance at their intersections as to form a matrix of mutual capacitors with mutual capacitances 112. As understood by those with ordinary skill in the art, the intersection of each of the drive lines D1-D4 and sense lines S1-S4 may form a plurality of pixels 118 (e.g. touch sensors) across the entirety of the touchscreen 104.

In various embodiments, the drive lines D1-D4 may be coupled to drive circuitry 114 and the sense lines S1-S4 may be coupled to sense circuitry 116 that are each coupled to the touchscreen controller 102. As appreciated by those with ordinary skill in the art, each of the drive lines and the sense lines may also have a self-capacitance 113 that is measurable. In other words, touches to the surface of the touchscreen 104 may be detected using mutual sensing scans and/or self-sensing scans.

In various embodiments, the touch data gathered by the mutual sensing and/or self-sensing scans may be processed by the touchscreen controller 102. In other words, the touchscreen controller 102 may analyze a matrix of touch data to determine the coordinates of a touch point. Based on the touch data collected from scanning, the touchscreen 104 may be used by the touchscreen controller 102 to determine the coordinates of a touch point, and report them to the application processor 106 in a touch event protocol. Then, the application processor 106 may provide an output to the touchscreen 104 in response to the reported coordinates of touch.

As described above, the resolution of the coordinates of a touch point are limited to the resolution of the touchscreen 104. Advantageously, embodiments of the present application disclose a method for determining coordinates of a touch with an improved resolution. In other words, the electronic device 100 may be configured to determine coordinates of a touchpoint on the surface of the touchscreen 104 with a resolution greater than the resolution of the touchscreen 104 based on an instruction and scaled up touch point coordinates included in a touch event protocol.

Advantageously, an improved touch resolution allows for an improved touch accuracy in fast moving applications such as augmented reality (AR), virtual reality (VR) applications, gaming, and the like, resulting in an improved user experience.

Figure 2:
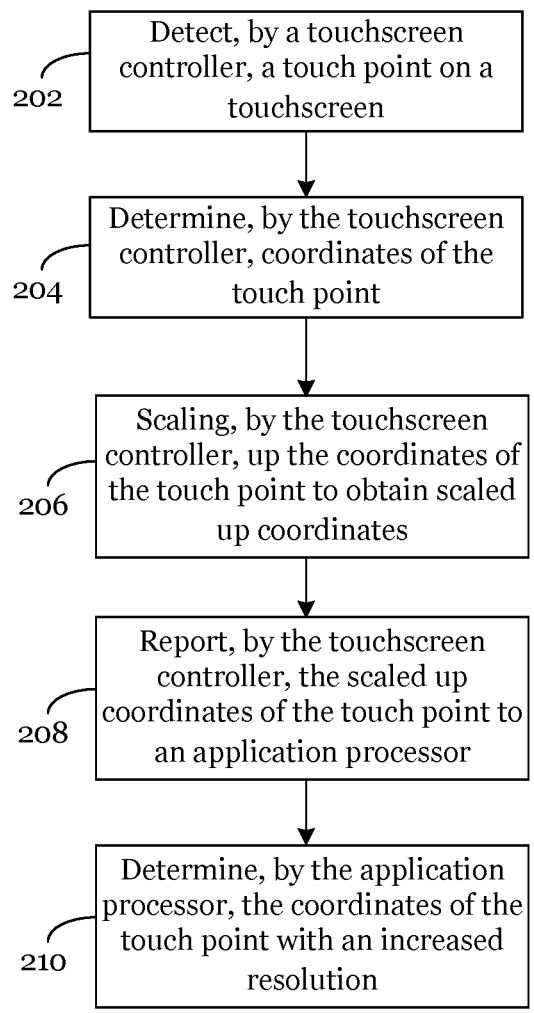
FIG. 2 illustrates a process flow for determining touch coordinates with a resolution greater than the resolution of the touchscreen in accordance with an embodiment of the present application.

FIG. 2 illustrates a process flow for determining touch coordinates with a resolution greater than the resolution of the touchscreen in accordance with an embodiment of the present application.

Although embodiments described below described a single touch point, this is for example purposes only. Embodiments of the present application may be used to determine a single touch point (i.e. a single finger touch) or a multiple touch points (i.e. multiple finger touch). In other words, the electronic device 100 may detect multiple coordinates from multiple touch points with a resolution greater than the resolution of the touchscreen 104 from a single sensing scan.

As illustrated in block 202, and described with reference to FIG. 1, the touchscreen controller 102 may detect touch corresponding to a touch point on the touchscreen 104. The touchscreen controller 102 may detect the touch point using either or both of the sensing scans described above.

As next illustrated in block 204 and described with reference to FIG. 1, the touchscreen controller 102 may determine the coordinates of the touch point. As understood by those with ordinary skill in the art the coordinates of the touch point may have the same resolution as the resolution of the touchscreen 104. The coordinates of the touch point may include a horizontal coordinate (x-coordinate) and a vertical coordinate (y-coordinate) that correspond to a respective drive line and sense line. The coordinates of the touch point may correspond to an intersection between a drive line and a sense line. In other words, as described above, the coordinates of the touch point may be in whole pixel units. As understood by those with ordinary skill in the art, the touchscreen controller 102 determines information (e.g. bits of information) corresponding to the coordinates of the touch point that may be removed in order for the coordinates of the touch point to match the resolution of the touchscreen 104. This will be explained in more detail below.

As next illustrated in block 206, the touchscreen controller 102 may determine scaled up coordinates of the touch point. In various embodiments, the touchscreen controller 102 may determine the coordinates of the touch point using an infinite impulse response (IIR) filter, scale-up the determined touch coordinates, and round up the scaled-up touch coordinates. Alternately, in some embodiments, the floor or ceiling of the scaled-up touch coordinates may be determined instead of rounding.

In various embodiments, the touchscreen controller 102 may scale up the coordinates of the touch point in a touch event payload by overwriting a reserved portion of a touch event protocol used to report touch coordinates to the application processor 106. Details of the touch event protocol format will be discussed in more detail below.

The touchscreen controller 102 may add additional digits at the end of each of the coordinates of the touch point. In other words, after determining the coordinates of the touch point using the IIR filter, the touchscreen controller 102 may determine additional information (e.g. bits of information) and include them in the touch event protocol. The touchscreen controller 102 may add at least one digit to the end of each of the coordinates of the touch point. For example if the touch coordinates are (1000.x, 1500.y), the touchscreen controller 102 may scale them up by adding a digit at the end of both coordinates (1000x, 1500y). In a specific example, the initial touch coordinate may be (993, 1005), the output from the IIR filter may be (993.29, 1005.21), and the scaled-up coordinate including rounding is (9933, 10052). Although in these illustrations, a tenth scaling is shown, alternative embodiments may also include other scaling such as hundredth, and others.

As next illustrated in block 208, the touchscreen controller 102 may report the scaled up coordinates of the touch point to the application processor 106. As described above, the touchscreen controller 102 may report the scaled up coordinates of the touch point in a touch event protocol.

As next illustrated in block 210, the application processor 106 may determine coordinates of a touch point with an increased resolution. In various embodiments, the application processor 106 may determine the touch coordinates with an increased resolution by converting the scaled-up coordinates into floating point format. The application processor 106 may add a decimal point to the scaled up coordinates so that the number of digits of the whole pixel part (e.g. values to the left of the decimal of the floating point value) remain the same as they were prior to scaling. In other words, the application processor 106 may convert the scaled up coordinates of the touch point so that digits added when scaling-up are included on the right hand side of the decimal. Referring back to the example described above, if one extra digit is added by the touchscreen controller 102 when scaling-up the coordinates, the extra digit will be positioned in the tenths place of the coordinates of the touch point with improved resolution. For example, the application processor may convert the scaled up coordinates from (1000x, 1500y) to (1000.x, 1500.y). Advantageously, this allows for coordinates of a touch point to possibly correspond to a position between intersections of drive lines and sense lines.

Advantageously, in various embodiments, the electronic device 100, may be configured to determine coordinates of a touch point with a resolution equal to the resolution of the touchscreen 104, or touch coordinates with a resolution greater than the resolution of the touchscreen 104.

Figure 3:
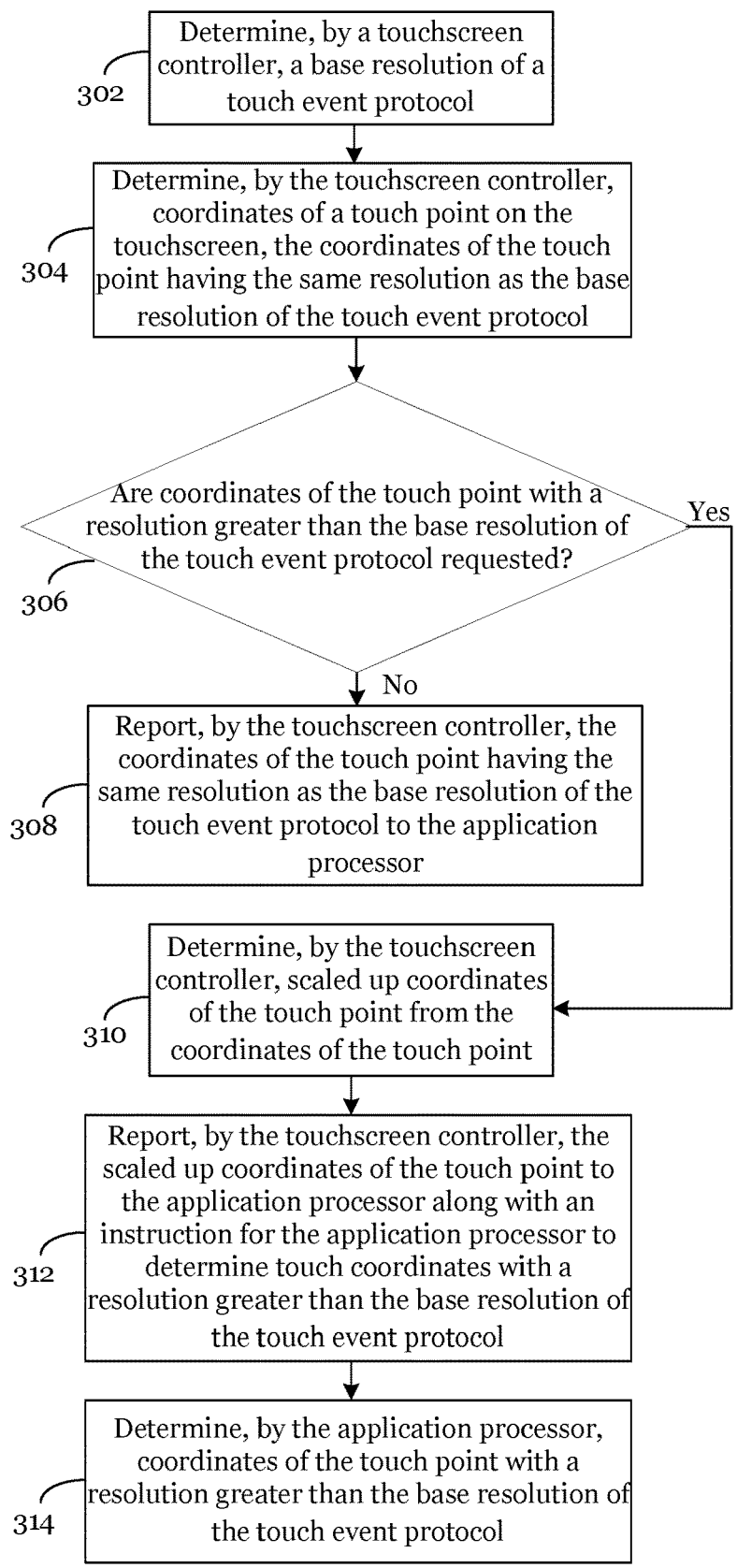
FIG. 3 illustrates a process flow for determining touch coordinates with a resolution greater than the resolution of the touchscreen or touch coordinates with a resolution equal to the resolution of the touchscreen in accordance with an embodiment of the present application.

FIG. 3 illustrates a process flow for determining touch coordinates with a resolution greater than the resolution of the touchscreen or touch coordinates with a resolution equal to the resolution of the touchscreen in accordance with an embodiment of the present application.

As illustrated in block 302 and described with reference to FIG. 1, the touchscreen controller 102 may determine a base resolution of a touch event protocol. As described above, the touchscreen controller 102 may use a touch event protocol to report the coordinates of a touch point. In various embodiments, the base resolution of the touch event protocol is the same resolution of the touchscreen 104.

As next illustrated in block 304 and described with reference to FIG. 1, the touchscreen controller 102 may determine coordinates of a touch point that have the same resolution as the base resolution of the touch event protocol.

As next illustrated in block 306 and described with reference to FIG. 1, the touchscreen controller 102 may determine whether coordinates of the touch point with a resolution greater than the base resolution of the touch event protocol are requested by the application processor 106. In various embodiments, the application processor 106 may request the coordinates of the touch point with a resolution greater than the base resolution of the touch event protocol by sending a command to the touchscreen controller 102.

Referring back to FIG. 3, if the touchscreen controller 102 determines that the application processor 106 did not request coordinates of the touch point with a resolution greater than the base resolution of the touch event protocol, the method proceeds to block 308 and touchscreen controller 102 reports the coordinates of the touchpoint with the same resolution as the touch event protocol to the application processor 106.

On the other hand, if the touchscreen controller 102 determines that the application processor 106 did request coordinates of the touch point with a resolution greater than the base resolution of the touch event protocol the method proceeds to blocks 310-314.

As next illustrated in block 310 and described with reference to FIG. 1, in response to determining that coordinates of the touch point with a resolution greater than the base resolution of the touch event protocol are requested, the touchscreen controller 102 may determine scaled up coordinates of the touch point. The scaled up coordinates of the touch point may be determined by the touchscreen controller 102 in the same manner described above.

As next illustrated in block 312 and described with reference to FIG. 1, the touchscreen controller 102 may report the scaled up coordinates of the touch point and an instruction to determine coordinates of the touch point with a resolution greater than the base resolution of the touch event protocol to the application processor 106. In various embodiments, the touchscreen controller 102 may report the scaled up coordinates of the touch point in the same manner discussed above and instruct the application processor to determine coordinates of the touch point with a resolution greater than the base resolution of the touch event protocol by setting an enable bit of the touch event protocol.

As next illustrated in block 314 and described with reference to FIG. 1, the application processor 106 may determine coordinates of the touch point with a resolution greater than the base resolution of the touch event protocol. The application processor 106 may determine the coordinates of the touch point with a resolution greater than the base resolution of the touch event protocol in the same manner described above.

FIGS. 4A-4B illustrate schematic views of touch event protocols used to report touch coordinates with the same resolution of the touchscreen and a touch event protocol used to report touch coordinates with a resolution greater than the resolution of the touchscreen according to an embodiment of the present application, where FIG. 4A illustrates a 40-bit touch event protocols, and FIG. 4B illustrates 64-bit touch event protocols.

Referring to FIG. 4A, both touch event payloads may comprise 48-bits (e.g. bytes 0-5). In other words, a touch event (regardless of payload type) may be reported using a 48-bit message including an event ID, a touch ID, a resolution flag, a touch type (e.g. touch by a finger, a gesture, touch by an active stylus, or the like), and the x coordinates and y-coordinates of the detected touch. All of this information may be provided within 40 bits (hence bytes 0-4), for example.

As an illustration, in various embodiments, the event ID may span bits 4-7 of byte 0. The event ID may comprise a unique value indicative of a specific touch event. In cases with multiple touches, such as a two-finger touch for example, two touch event payloads may have the same event ID.

The touch ID may span bits 0-3 of byte 0. The touch ID may be an identifier to distinguish touches in a multiple touch event. For example in a two finger touch event two different payloads may have the same event ID but different touch ID's to distinguish touch from each finger.

The resolution flag may span bits 4-7 of byte 0. The resolution flag may be used to inform the application processor 106 whether a touch event payload is a 48-bit standard touch event payload 402 or a 48-bit touch event payload with scaled up coordinates 404. In other words if the resolution flag is enabled, the application processor 106 is informed that the touch event payload is a 48-bit touch event payload with scaled up coordinates 404. An enabled resolution flag instructs the application processor 106 to convert scaled up coordinates in a 48-bit touch event payload with scaled up coordinates 404 into floating point values. This will be described in more detail below.

As understood by those with ordinary skill in the art, when calculating the coordinates of the touch point, the touchscreen controller 102 may determine a 32-bit value (e.g. 16 bits for each coordinate). However to match the resolution of the touchscreen 104 (i.e. the base resolution a touch event payload), the touchscreen controller 102 may reduce the 32-bit value to a 24-bit value (e.g. 12 bits for each coordinate) that span bytes 2-4, of the 48-bit standard touch event payload 402 for example.

In other words, referring back to FIG. 4A, the touchscreen controller 102 may determine 16-bit values corresponding to each coordinate of the touchpoint, and reduce those values to 12-bit coordinates to fit within the 48-bit standard touch event payload 402 (i.e. to match the resolution of the touchscreen 104). In other words, the 48-bit standard touch event payload 402 may comprise 12-bit values corresponding to the x and y coordinates of the touch point in bytes 3-4 while byte 5 is reserved.

In various embodiments, and as described above, based on a command from the application processor 106 requesting coordinates of the touch point with improved resolution, the touchscreen controller 102 may overwrite the reserved bits of byte 5 to generate a 48-bit touch event protocol with scaled up coordinates 404. In other words, after generating the 48-bit standard touch event payload 402, the touchscreen controller 102 may scale up the coordinates of the touch point by bringing back the bits that were reduced (or cut off)

using an using an IIR filter. The touchscreen controller 102 may generate scaled up coordinates of the touch point. As an illustration, the 16-bit X-coordinate value may be now occupy byte 2 and byte 3 while the 16-bit Y-coordinate value may be now occupy byte 4 and byte 5.

In addition, as described above, the resolution flag in byte 1 may be used to instruct the application processor 106 to convert the scaled up coordinates into floating point values. In other words, the touchscreen controller 102 may overwrite reserved byte 5 to include additional information corresponding to the coordinates of the touch point and enable the resolution flag. The 48-bit touch event payload with scaled up coordinates 404 may include x and y coordinates that are 16-bit values (32-bits total) that span bytes 2-5. As understood by those with ordinary skill in the art, a 16-bit value may have one extra digit than a 12-bit value in decimal (i.e. base 10), resulting in scaled up touch coordinates.

Alternatively, if the touchscreen controller 102 does not receive the command from the application processor 106 it may leave the resolution flag as disabled, and report the 48-bit standard touch event payload 402 to the application processor 106.

FIG. 4B illustrates a 64-bit standard touch event payload 406 and a 64-bit touch event payload with scaled up coordinates 408 according to an embodiment of the present application.

Referring to FIG. 4B, both touch event payloads may comprise 64-bits (e.g. bytes 0-7). In other words, a touch event (regardless of payload type) may be reported using a 64-bit message including an event ID, a touch ID, a touch type (e.g. touch by a finger, a gesture, touch by an active stylus, or the like), and the x coordinates and y-coordinates of the detected touch.

In various embodiments, in 48-bit and 64-bit touch event payloads, the event ID, the touch type, the x and y coordinates of touch (in both types of payloads) are in the same location. The differences between 48-bit and 64-bit touch payloads are discussed below.

A first difference is that in 64-bit payloads, the touch ID is located in bits 4-7 of byte 1, and the resolution flag is moved to bits 0-1 of byte 0. In place of the touch ID in a 64-bit payload, bits 2-3 are reserved, and bits 0-1 include the resolution flag. In various embodiments, bits 2-3 are reserved for additional features such as touch pressure data, major axis data, minor axis data, touch angle data, or the like.

Another difference is that byte 6 (which is not included in a 48-bit payload) is reserved. In various embodiments, byte 6 may also be reserved for additional features such as touch pressure data, major axis data, minor axis data, touch angle data, or the like.

Another difference is that bits 0-5 of byte 7 (which is not included in a 48-bit payload) include Evtleft. In various embodiments, Evtleft is used to indicate the number of touch events remaining in a first in first out (FIFO) buffer of the application processor 106.

Also, in the same manner described above, the differences between a 64-bit standard touch event payload 406 and a 64-bit touch event payload with scaled up coordinates 408 are the same as the differences between a 48-bit standard touch event payload 402 and a 48-bit touch event payload with scaled up coordinates 404.

Although in the payloads described above, the resolution flag is located in byte 0 or byte 1, the location of the resolution flag is not limited by this application. In other words, any of the bits in a reserved payload may be used as the resolution flag.

Example embodiments of the invention are summarized here. Other embodiments can also be understood from the entirety of the specification as well as the claims filed herein.

Example 1. A method for operating an electronic device, the method including: detecting, by a touchscreen controller, a touch point on a touchscreen; determining, by the touchscreen controller, coordinates of the touch point; scaling, by the touchscreen controller, up the coordinates of the touch point to obtain scaled up coordinates by overwriting a reserved portion of a touch event protocol with additional information corresponding to the coordinates of the touch point; reporting, by the touchscreen controller, the scaled up coordinates of the touch point to an application processor; and determining, by the application processor, the coordinates of the touch point with an increased resolution by converting the scaled up coordinates into a floating point value.

Example 2. The method of example 1, where scaling up the coordinates includes adding an extra digit to the coordinates of the touch point, where the coordinates of the touch point are floating point values with the extra digit in a tenths position, the extra digit being indicative of a tenth of a pixel.

Example 3. The method of one of examples 1 or 2, where overwriting a reserved portion of the touch event protocol with additional information corresponding to the coordinates of the touch point includes adding an extra digit to the coordinates of the touch point.

Example 4. The method of one of examples 1 to 3, where the coordinates of the touch point with the increased resolution include floating point values with the extra digit in a tenths position, the extra digit being indicative of a tenth of a pixel.

Example 5. The method of one of examples 1 to 4, where the coordinates of the touch point with an increased resolution are floating point values including a tenths digit, the tenths digit being indicative of a tenth of a pixel.

Example 6. The method of one of examples 1 to 5, where pixels of a touch sensitive layer of the touchscreen and pixels of a display of the touchscreen are aligned with each other.

Example 7. The method of one of examples 1 to 6, where the touch sensitive layer of the touchscreen includes: a plurality of sense lines formed across rows of the touch sensing layer; a plurality of drive lines formed across columns of the touch sensing layer; and a plurality of pixels formed by intersections between the drive lines and sense lines.

Example 8. A method for operating an electronic device, the method including: determining, by a touchscreen controller, a base resolution of a touchscreen; determining, by the touchscreen controller, coordinates of a touch point on the touchscreen, the coordinates of the touch point having the same resolution as the base resolution of the touchscreen; determining, by the touchscreen controller, whether coordinates of the touch point with a resolution greater than the base resolution of the touchscreen are requested by an application processor; and in response to determining, by the touchscreen controller, that coordinates of the touch point with a resolution greater than the base resolution of the touchscreen are requested, determining scaled up coordinates of the touch point from the coordinates of the touch point, and generating a first touch event data payload including the scaled up coordinates, and reporting, by the touchscreen controller, the first touch event data payload; and determining from the first touch event data payload, by the application processor, coordinates of the touch point with a resolution greater than the base resolution of the touchscreen.

Example 9. The method of example 8, where the generating includes using a first reserved field of a base touch event protocol for sending portions of the scaled up coordinates and a second reserved field for a flag for the application processor to determine touch coordinates with a resolution greater than the base resolution of the touchscreen.

Example 10. The method of one of examples 8 or 9, further including: in response to determining, by the touchscreen controller, that coordinates of the touch point with a resolution greater than the base resolution of the touchscreen are not requested, generating a second touch event data payload including the coordinates of the touch point having the same resolution as the base resolution of the touchscreen to the application processor, and reporting, by the touchscreen controller, the second touch event data payload; and determining from the second touch event data payload, by the application processor, coordinates of the touch point with a resolution greater than the base resolution of the touchscreen.

Example 11. The method of one of examples 8 to 10, where determining, by the application processor, the coordinates of the touch point with a resolution greater than the base resolution of the touchscreen includes converting the scaled up coordinates to floating point values.

Example 12. The method of one of examples 8 to 11, where the coordinates of the touch point with a resolution greater than the base resolution of the touchscreen are floating point values including a tenth digit, the tenth digit being indicative of a tenth of a pixel of the touchscreen.

Example 13. The method of one of examples 8 to 12, where determining the scaled up the coordinates includes adding an extra digit to the coordinates of the touch point.

Example 14. The method of one of examples 8 to 13, where the coordinates of the touch point with a resolution greater than the base resolution of the touchscreen are floating point values with the extra digit in a tenths position, the extra digit being indicative of a tenth of a pixel.

Example 15. The method of one of examples 8 to 14, where the touchscreen includes a touch sensing layer and a display layer, the touch sensing layer including: a plurality of sense lines formed across rows of the touchscreen; a plurality of drive lines formed across columns of the touchscreen; and a plurality of pixels formed by intersections between the drive lines and sense lines.

Example 16. The method of one of examples 8 to 15, where pixels of the touch sensing layer and pixels of the display layer are aligned.

Example 17. An electronic device, the device including: a touchscreen; a touchscreen controller; and a memory for storing a program to be executed in the controller, the program including instructions when executed cause the controller to: detect a touch point on a touchscreen; determine coordinates of the touch point; scale up the coordinates of the touch point to obtain scaled up coordinates by overwriting a reserved portion of a touch event protocol with additional information corresponding to the coordinates of the touch point; report the scaled up coordinates of the touch point to an application processor; and determine coordinates of a touch point with an increased resolution by converting the scaled up coordinates into floating point values.

Example 18. The device of example 17, where scaling up the coordinates includes adding an extra digit to the coordinates of the touch point, where the coordinates of the touch point are floating point values with the extra digit in a tenths position, the extra digit being indicative of a tenth of a pixel.

Example 19. The device of one of examples 17 or 18, where overwriting a reserved portion of a touch event protocol with additional information corresponding to the coordinates of the touch point includes adding an extra digit to the coordinates of the touch point.

Example 20. The device of one of examples 17 to 19, where the coordinates of the touch point with an increased resolution are floating point values including a tenth digit, the tenth digit being indicative of a tenth of a pixel.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

What is claimed is:

1. A method for operating an electronic device, the method comprising:
   detecting, by a touchscreen controller, a touch point on a touchscreen;
   determining, by the touchscreen controller, coordinates of the touch point;
   scaling, by the touchscreen controller, up the coordinates of the touch point to obtain scaled up coordinates by overwriting a reserved portion of a touch event protocol with additional information corresponding to the coordinates of the touch point;
   reporting, by the touchscreen controller, the scaled up coordinates of the touch point to an application processor; and
   determining, by the application processor, the coordinates of the touch point with an increased resolution by converting the scaled up coordinates into a floating point value, wherein the coordinates of the touch point with the increased resolution are floating point values including a tenths digit, the tenths digit being indicative of a tenth of a pixel.

2. The method of claim 1, wherein scaling up the coordinates comprises adding an extra digit to the coordinates of the touch point, wherein the coordinates of the touch point are the floating point values with the extra digit in a tenths position, the extra digit being indicative of the tenth of a pixel.

3. The method of claim 1, wherein overwriting a reserved portion of the touch event protocol with additional information corresponding to the coordinates of the touch point comprises adding an extra digit to the coordinates of the touch point.

4. The method of claim 3, wherein the coordinates of the touch point with the increased resolution comprise the floating point values with the extra digit in a tenths position, the extra digit being indicative of the tenth of a pixel.

5. The method of claim 1, wherein pixels of a touch sensitive layer of the touchscreen and pixels of a display of the touchscreen are aligned with each other.

6. The method of claim 5, wherein the touch sensitive layer of the touchscreen comprises:
   a plurality of sense lines formed across rows of the touch sensing layer;
   a plurality of drive lines formed across columns of the touch sensing layer; and
   a plurality of pixels formed by intersections between the drive lines and sense lines.

7. The method of claim 1, wherein the coordinates of the touch point are determined at a base resolution, determining, by the touchscreen controller, whether coordinates of the touch point with a resolution greater than the base resolution of the touchscreen are requested by an application processor, wherein the scaling up is performed in response to determining, by the touchscreen controller, that coordinates of the touch point with a resolution greater than the base resolution of the touchscreen are requested.

8. The method of claim 1, wherein reporting the scaled up coordinates of the touch point comprises generating a first touch event data payload comprising the scaled up coordinates, and reporting the first touch event data payload, wherein the increased resolution comprises a resolution greater than the base resolution of the touchscreen.

9. A method for operating an electronic device, the method comprising:
   determining, by a touchscreen controller, a base resolution of a touchscreen;
   determining, by the touchscreen controller, coordinates of a touch point on the touchscreen, the coordinates of the touch point having the same resolution as the base resolution of the touchscreen;
   determining, by the touchscreen controller, whether coordinates of the touch point with a resolution greater than the base resolution of the touchscreen are requested by an application processor; and
   in response to determining, by the touchscreen controller, that coordinates of the touch point with a resolution greater than the base resolution of the touchscreen are requested,
      determining scaled up coordinates of the touch point from the coordinates of the touch point, and
      generating a first touch event data payload comprising the scaled up coordinates, and
      reporting, by the touchscreen controller, the first touch event data payload; and
   determining from the first touch event data payload, by the application processor, coordinates of the touch point with a resolution greater than the base resolution of the touchscreen, wherein the coordinates of the touch point with a resolution greater than the base resolution of the touchscreen are floating point values including a tenth digit, the tenth digit being indicative of a tenth of a pixel of the touchscreen.

10. The method of claim 9, wherein the generating comprises using a first reserved field of a base touch event protocol for sending portions of the scaled up coordinates and a second reserved field for a flag for the application processor to determine touch coordinates with a resolution greater than the base resolution of the touchscreen.

11. The method of claim 9, further comprising:
   in response to determining, by the touchscreen controller, that coordinates of the touch point with a resolution greater than the base resolution of the touchscreen are not requested,
      generating a second touch event data payload comprising the coordinates of the touch point having the same resolution as the base resolution of the touchscreen to the application processor, and
      reporting, by the touchscreen controller, the second touch event data payload; and
   determining from the second touch event data payload, by the application processor, coordinates of the touch point with a resolution greater than the base resolution of the touchscreen.

12. The method of claim 9, wherein determining, by the application processor, the coordinates of the touch point with a resolution greater than the base resolution of the touchscreen comprises converting the scaled up coordinates to floating point values.

13. The method of claim 9, wherein determining the scaled up the coordinates comprises adding an extra digit to the coordinates of the touch point.

14. The method of claim 13, wherein the coordinates of the touch point with a resolution greater than the base resolution of the touchscreen are the floating point values with the extra digit in a tenths position, the extra digit being indicative of the tenth of a pixel.

15. The method of claim 9, wherein the touchscreen comprises a touch sensing layer and a display layer, the touch sensing layer comprising:
   a plurality of sense lines formed across rows of the touchscreen;
   a plurality of drive lines formed across columns of the touchscreen; and
   a plurality of pixels formed by intersections between the drive lines and sense lines.

16. The method of claim 15, wherein pixels of the touch sensing layer and pixels of the display layer are aligned.

17. An electronic device, the device comprising:
   a touchscreen;
   a touchscreen controller; and
   a memory for storing a program to be executed in the controller, the program comprising instructions when executed cause the controller to:
      detect a touch point on a touchscreen;
      determine coordinates of the touch point;
      scale up the coordinates of the touch point to obtain scaled up coordinates by overwriting a reserved portion of a touch event protocol with additional information corresponding to the coordinates of the touch point;
      report the scaled up coordinates of the touch point to an application processor; and
      determine coordinates of a touch point with an increased resolution by converting the scaled up coordinates into floating point values, wherein the coordinates of the touch point with an increased resolution are floating point values including a tenth digit, the tenth digit being indicative of a tenth of a pixel.

18. The device of claim 17, wherein scaling up the coordinates comprises adding an extra digit to the coordinates of the touch point, wherein the coordinates of the touch point are the floating point values with the extra digit in a tenths position, the extra digit being indicative of the tenth of a pixel.

19. The device of claim 17, wherein overwriting a reserved portion of a touch event protocol with additional information corresponding to the coordinates of the touch point comprises adding an extra digit to the coordinates of the touch point.

20. The device of claim 17, wherein the coordinates of the touch point are determined at a base resolution, determining, by the touchscreen controller, whether coordinates of the touch point with a resolution greater than the base resolution of the touchscreen are requested by an application processor, wherein the scaling up is performed in response to determining, by the touchscreen controller, that coordinates of the touch point with a resolution greater than the base resolution of the touchscreen are requested, wherein reporting the scaled up coordinates of the touch point comprises generating a first touch event data payload comprising the scaled up coordinates, and reporting the first touch event data payload, wherein the increased resolution comprises a resolution greater than the base resolution of the touchscreen.

\* \* \* \* \*